United States Patent [19]
Takinomi

[11] Patent Number: 6,163,170
[45] Date of Patent: *Dec. 19, 2000

[54] LEVEL CONVERTER AND SEMICONDUCTOR DEVICE

[75] Inventor: Yutaka Takinomi, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/857,269

[22] Filed: May 16, 1997

[30] Foreign Application Priority Data

Nov. 28, 1996 [JP] Japan ................................ 8-318268

[51] Int. Cl.$^7$ ........................................ H03K 19/0175
[52] U.S. Cl. ........................... 326/81; 326/68; 327/333
[58] Field of Search ........................... 326/68, 80, 81, 326/83, 86, 121, 27; 327/333

[56] References Cited

U.S. PATENT DOCUMENTS

| | | | |
|---|---|---|---|
| 4,080,539 | 3/1978 | Stewart | 326/81 |
| 4,926,070 | 5/1990 | Tanaka et al. | 326/81 |
| 5,146,109 | 9/1992 | Martignoni et al. | 326/83 |
| 5,680,064 | 10/1997 | Masaki et al. | 326/81 |
| 5,768,204 | 6/1998 | Muraoka | 365/210 |

FOREIGN PATENT DOCUMENTS

| | | |
|---|---|---|
| 0 150 480 | 8/1985 | European Pat. Off. . |
| 0 482 661 A2 | 4/1992 | European Pat. Off. . |
| 0 650 257 A2 | 4/1995 | European Pat. Off. . |
| 1 152 817 | 6/1989 | Japan . |
| 2 291 549 | 1/1996 | United Kingdom . |

*Primary Examiner*—Michael Tokar
*Assistant Examiner*—Daniel D. Chang
*Attorney, Agent, or Firm*—Arent Fox Kinter Plotkin & Khan, PLLC

[57] ABSTRACT

A level converter includes a first circuit which converts a first level of a signal into a second level which is higher than the first level, and a second circuit which causes a potential of a given node of the level converter to be defined rapidly when the level converter is in a state other than a normal state in which the first circuit converts the first level of the signal into the second level.

14 Claims, 15 Drawing Sheets

LEVEL CONVERTER AND SEMICONDUCTOR DEVICE

BACKGROUND OF THE INVENTION

1. Field of the Invention

The present invention generally relates to a level converter which converts an input voltage level into another level, and more particularly to a level converter which is suitably provided in an LSI device and boosts the voltage of a signal, a boosted signal being output to the outside of the LSI device.

Recent LSI devices (semiconductor devices) are required to have a low power consumption and a low noise characteristic. Nowadays, the LSI devices are designed to operate with a reduced internal power supply voltage in order to satisfy the above requirement.

2. Description of the Related Art

A reduced internal power supply voltage is applied to an internal circuit of an LSI device in order to attempt to reduce the power consumed therein and operate at a low noise level. When such an LSI device is used, it is required to consider the conformity with a power supply voltage applied to an external circuit or device connected to the LSI device. Hereinafter, such an external circuit or device will be referred to as external interface circuit.

If the internal power supply voltage applied to the internal circuit of the LSI device is lower than the power supply voltage applied to the external interface circuit and is applied thereto without any modification, the external interface circuit will not operate normally. For example, if the internal power supply voltage is 3 V and the power supply voltage applied to the external interface circuit is 5 V, the signal output by the internal circuit of the LSI device swings between 0 V and 3 V (an amplitude equal to 3 V). The external interface circuit requires a signal input which swings between 0 V and 5 V (an amplitude equal to 5 V). Hence, a level converter is provided inside the LSI device and converts the voltage of the signal to a level necessary for the external interface circuit to operate properly. In the example as described above, the level converter converts the 3V signal output by the internal circuit of the LSI device into a 5V signal, which is then output to the external interface circuit.

FIG. 1 is a circuit diagram of a conventional level converter, which is made up of field-effect transistors M3, M4, M5 and M6 connected in a fashion shown therein. The transistors M3–M6 are, for example, MOS (Metal Oxide Semiconductor) transistors. The transistors M3 and M5 are P-channel MOS transistors, and the transistors M4 and M6 are N-channel MOS transistors. A power supply connected to the level converter has a high potential VDD2, and is equal to the high potential of a power supply supplied to an external interface circuit provided outside of the LSI device equipped with the above level converter and connected thereto. The power supply connected to the level converter has a low potential GND, which is the ground level. Hereinafter, the power supply voltage includes the meaning of the high potential of the power supply.

The transistors M1 and M2 are components of an internal circuit of the LSI device. The internal circuit is formed together with other components (not shown). The transistors M1 and M2 operate with an internal power supply having a high potential VDD1. The internal power supply voltage VDD1 is lower than the external power supply voltage VDD2 (VDD1<VDD2). The transistors M1 and M2 form an inverter (CMOS inverter).

A signal IN is supplied to the transistors M1 and M2 from a previous-stage circuit (not shown), which is a part of the internal circuit. The signal IN is applied to the gates of the transistors M1, M2 and M6. An output signal OUT of the level converter is obtained at a node at which the drains of the transistors M5 and M6 are connected together.

When the signal IN is at a low level, the transistors M1 and M4 are ON, and the gate of the transistor M5 is at the ground level GND. At this time, the transistor M6 is OFF. Hence, the output signal OUT is at a high level equal to the power supply voltage VDD2. When the signal IN is at a high level, the transistor M6 is ON, and the output signal OUT is at a low level equal to the ground level GND. At this time, the inverter outputs the low-level signal, and thus the transistor M4 is OFF. Since the transistor M6 is ON, the transistor M3 is ON.

In practice, as shown in FIG. 2, a buffer circuit 10 is provided so as to follow the level converter. An output terminal of the buffer circuit is connected to a terminal 11 for use in an external connection. The buffer circuit 10 is made up of a P-channel field-effect transistor M7 and an N-channel field-effect transistor M8. The output signal of the level converter is applied to the gates of the transistors M7 and M8.

In practice, there is a case as shown in FIG. 3. A circuit 12 having the same configuration as that made up of transistors M1–M6 is provided. The circuit 12 receives an input signal IN2 and has an output terminal connected to the gate of the transistor M8. An input signal IN1 is applied to the gates of the transistors M1 and M2 shown in FIG. 3. The input signal IN2 can be different from or identical to the input signal IN1. The circuit configuration shown in FIG. 3 is different from that shown in FIG. 2 in that the circuit configuration shown in FIG. 3 can set the terminal 11 to a high-impedance state. More particularly, when both the transistors M7 and M8 are turned OFF, the terminal 11 can be set to the high-impedance state.

However, the above-mentioned level converter has a disadvantage in that a pass-through current flows as indicated by broken lines shown in FIGS. 2 and 3 and thus a large amount of energy is consumed in the buffer circuit 10.

The internal power supply voltage VDD1 can be derived, in the LSI device, from the power supply voltage VDD2 externally supplied, or can be externally supplied. In any case, nodes N2 and N3 have indefinite voltages, as indicated in FIGS. 2 and 3, due to the relationship between the power supply voltages VDD1 and VDD2. As shown in FIG. 4, if the power supply voltage VDD2 rises first and the internal power supply voltage VDD1 rises second, the above problem will occur. More particularly, when the power supply voltage VDD2 rises while the internal power supply voltage VDD1 is equal to 0 V, the gate voltages of the transistors M1 and M2 (in other words, the signals IN (or IN1 and IN2)) are 0 V and the voltage of the node N1 is also 0 V. Hence, the transistors M4 and M6 are in the OFF state, and thus the nodes N2 and N3 are in the indefinite state. The indefinite voltages of the nodes N2 and N3 in the indefinite state may fall within a range shown as a hatched area in FIG. 4. If the indefinite voltage is applied to the node N3, both the transistors M7 and M8 will be turned ON, and the pass-through current will flow as shown in FIG. 2 or FIG. 3.

The above pass-through current will flow when the power supply is turned ON in the configuration in which the internal power supply voltage VDD1 is produced from the external power supply voltage VDD2. The pass-through current will also flow when both the voltages VDD1 and VDD2 are supplied externally and the voltage VDD1 is equal to or approximately equal to 0 V due to a fault or a particular factor which requires the power supply voltage VDD1 to be set equal to 0 V. In practice, many circuits like the configuration shown in FIG. 2 or FIG. 3 are formed in the LSI device, and the pass-through currents flow in the respective circuits. Hence, a large amount of current flows in total, and a large amount of energy is consumed in the LSI device.

As described above, the output voltage OUT of the conventional level converter can be settled (fixed) only when both the power supply voltages VDD1 and VDD2 are certainly applied to the circuit including the level converter. If the internal power supply voltage VDD1 is equal to or approximately equal to 0 V, the pass-through current will flow.

SUMMARY OF THE INVENTION

It is a general object of the present invention to provide a level converter and a semiconductor device using the same in which the above-mentioned problems are eliminated.

A more specific object of the present invention is to provide a reduced power consumption level converter which is capable of preventing a pass-through current from flowing and to provide a semiconductor device.

The above objects of the present invention are achieved by a level converter comprising: a first circuit which converts a first level of a signal into a second level which is higher than the first level; and a second circuit which causes a potential of a given node of the level converter to be defined rapidly when the level converter is in a state other than a normal state in which the first circuit converts the first level of the signal into the second level.

The level converter may be configured so that: the given node is an output terminal of the level converter via which a converted signal having the second level is output; and the second circuit sets a voltage of the output terminal of the level converter to either a high-potential level of a power supply voltage supplied to the level converter or a low-potential level thereof.

The level converter may be configured so that: the first circuit comprises first and second transistors having a P channel, and third and fourth transistors having an N channel; the first and third transistors are connected in series between the high-potential and low-potential levels of the power supply voltage; the second and fourth transistors are connected in series between the high-potential and low-potential levels of the power supply voltage; the first transistor has a gate connected to a first node at which the second and fourth transistors are connected in series, the first node forming the output terminal of the level converter; the second transistor has a gate connected to a second node at which the first and third transistors are connected in series; the signal applied to the first circuit and an inverted version thereof are applied to gates of the fourth and third transistors; and the second circuit comprises a capacitor having a first end connected to at least one of the first and second nodes, and a second end connected to one of the high-potential level and the low-potential level.

The level converter may be configured so that the capacitor is a MOS capacitor.

The level converter may be configured so that the second circuit comprises a switch which selectively connects the capacitor to one of the first and second nodes.

The above objects of the present invention are also achieved by a semiconductor device comprising: an internal circuit; a first level converter which has a first circuit which converts a first level of a signal output by the internal circuit into a second level which is higher than the first level; a buffer circuit which buffers an output signal of the first level converter having the second level; and a terminal connected to the buffer circuit and used to make a connection with an external element. The first level converter comprises a second circuit which causes a potential of a given node of the first level converter to be defined rapidly when the first level converter is in a state other than a normal state in which the first circuit converts the first level of the signal into the second level.

The semiconductor device may be configured so that: the internal circuit operates with a first power supply; the first level converter operates with a second power supply; and the second power supply has a voltage higher than that of the first power supply.

The semiconductor device may be configured so that the semiconductor device further comprises: a first terminal used to connect the first power supply to the internal circuit; and a second terminal used to connect the second power supply to the first level converter.

The semiconductor device may be configured so that the semiconductor device further comprises: a first terminal used to connect the second power supply a voltage step-down circuit; and the voltage step-down circuit which steps down the voltage of the second power supply and thus produces the voltage of the first power supply.

The semiconductor device may be configured so that it further comprises a second level converter having the same configuration as that of the first level converter, wherein the buffer circuit buffers output signals respectively output by the first and second level converters and outputs a resultant signal to the terminal.

The semiconductor device may be configured so that: the given node is an output terminal of the first level converter via which a converted signal having the second level is output; and the second circuit sets a voltage of the output terminal of the first level converter to either a high-potential level of a power supply voltage supplied to the first level converter or a low-potential level thereof.

The semiconductor device may be configured so that: the first circuit comprises first and second transistors of a P channel, and third and fourth transistors of an N channel; the first and third transistors are connected in series between the high-potential and low-potential levels of the power supply voltage; the second and fourth transistors are connected in series between the high-potential and low-potential levels of the power supply voltage; the first transistor has a gate connected to a first node at which the second and fourth transistors are connected in series, the first node forming the output terminal of the first level converter; the second transistor has a gate connected to a second node at which the first and third transistors are connected in series; the signal applied to the first circuit or an inverted version thereof applied to gates of the fourth and third transistors; and the second circuit comprises a capacitor having a first end connected to at least one of the first and second nodes, and a second end connected to one of the high-potential level and the low-potential level.

The semiconductor device may be configured so that the capacitor is a MOS capacitor.

The semiconductor device may be configured so that the second circuit comprises a switch which selectively connects the capacitor to one of the first and second nodes.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 5:
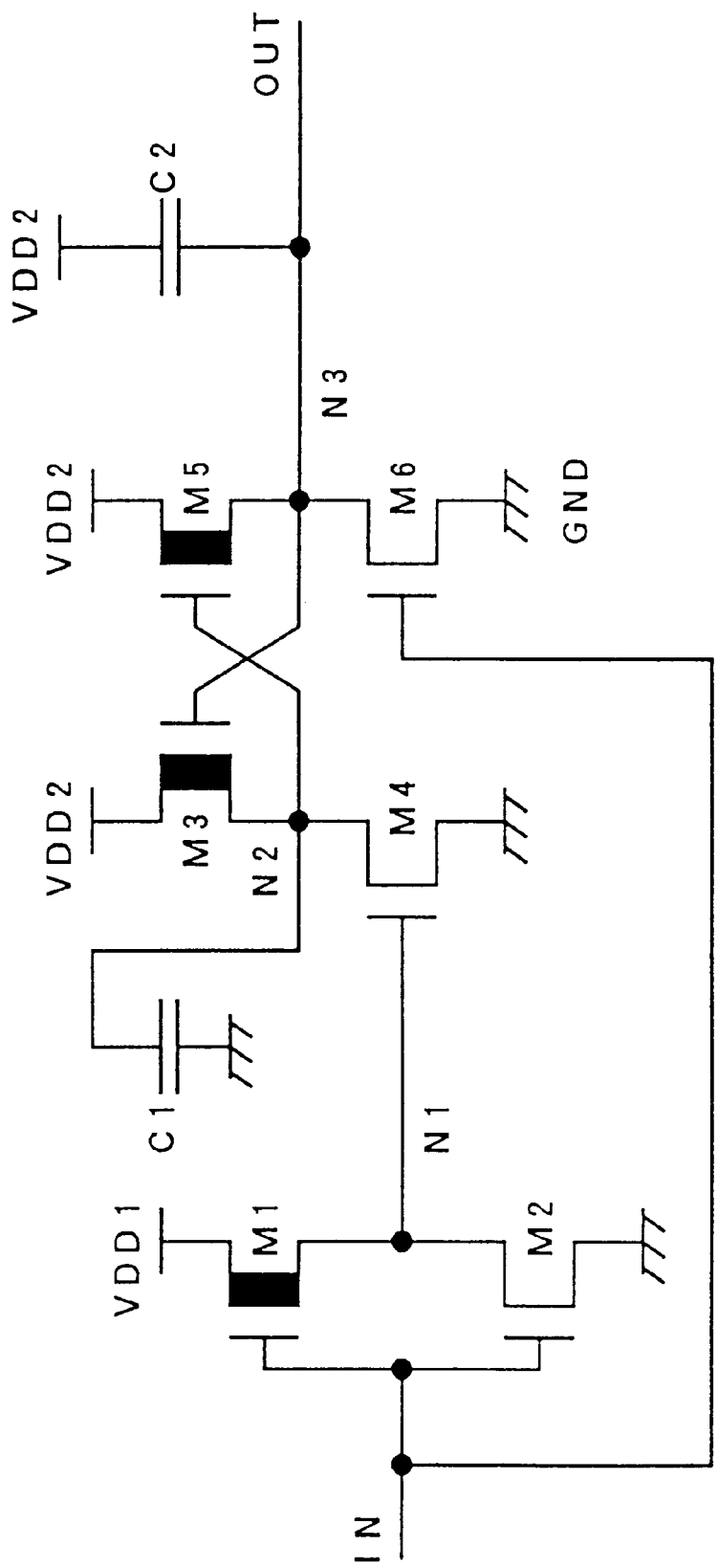
FIG. 5 is a circuit diagram of a level converter according to an embodiment of the present invention.

FIG. 5 is a circuit diagram of a level converter according to an embodiment of the present invention and a peripheral circuit thereof. In FIG. 5, parts that are the same as those shown in the previously described figures are given the same reference numbers.

Figure 1:
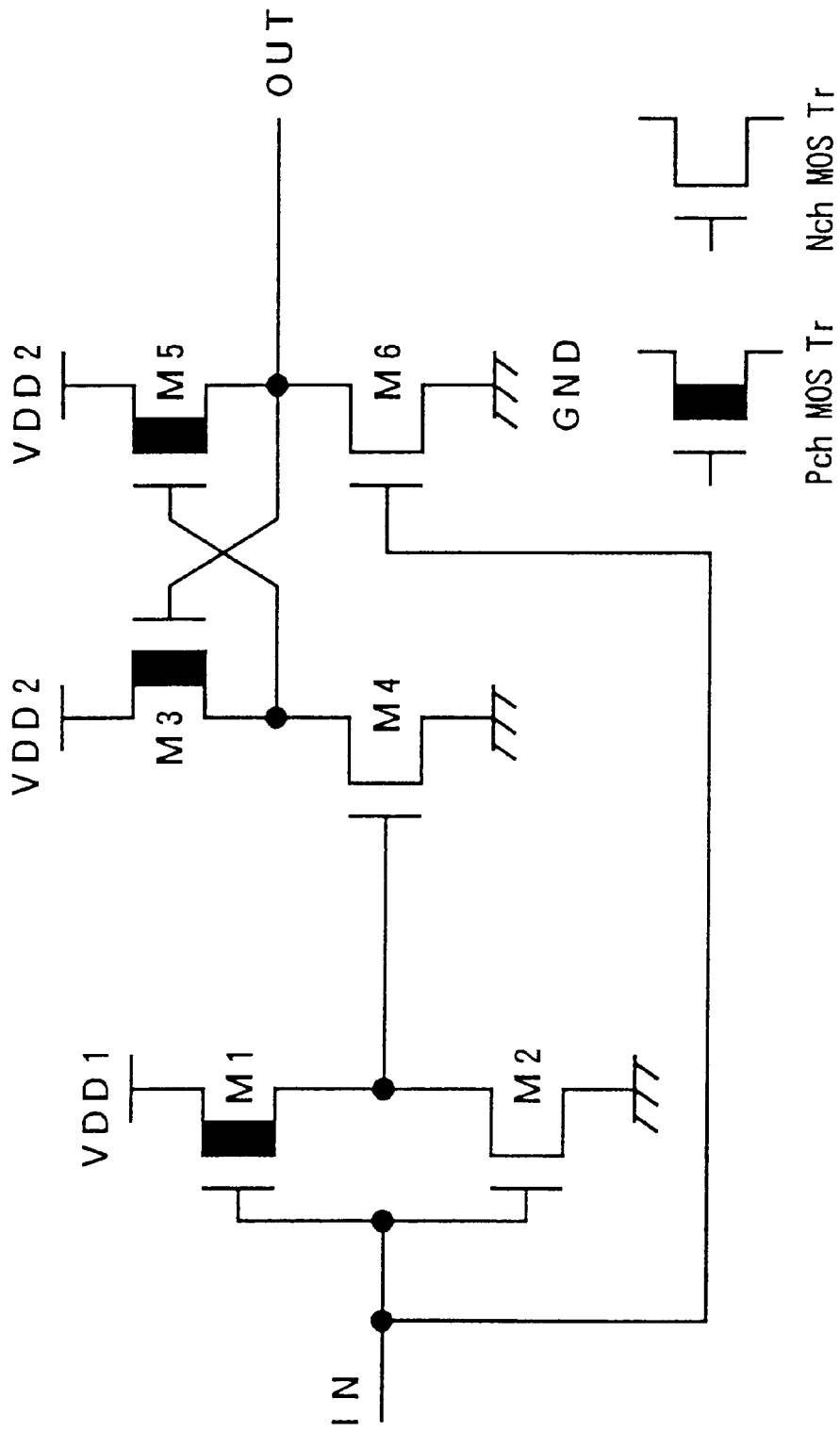
FIG. 1 is a circuit diagram of a conventional level converter.

Capacitors C1 and C2 are added to the configuration shown in FIG. 1. One end of the capacitor C1 is connected to the node N2, and the other end thereof is grounded (in other words, connected to the ground GND). One end of the capacitor C2 is connected to the node N3, and the other end thereof is supplied with the power supply voltage VDD2 (in other words, the other end is connected to a power supply line which carries the power supply voltage VDD2).

Figure 6:
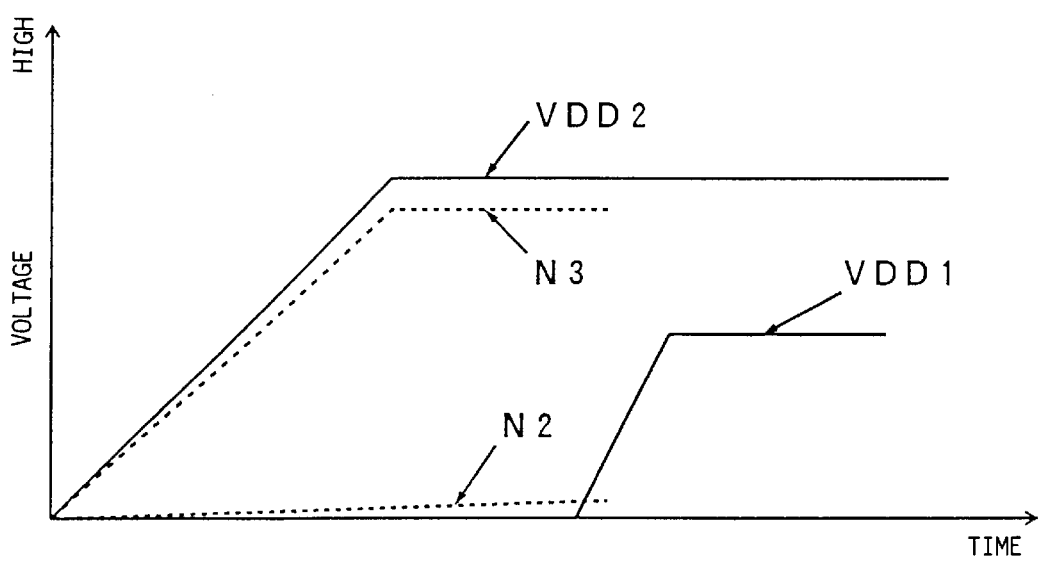
FIG. 6 is a graph showing an operation of the level converter shown in FIG. 5.

The functions of the capacitors C1 and C2 will be described with reference to FIG. 6. A case will be described where the power supply voltage VDD2 rises from 0 V and thereafter the internal power supply voltage VDD1 rises. When the power supply voltage VDD2 rises from 0 V, the potential of the node N3 rises from 0 V so as to approximately follow the rise of the power supply voltage VDD2. The capacitor C2 couples the node N3 with the power supply voltage VDD2 in the ac fashion, and isolates the node N3 therefrom in the dc fashion. That is, the capacitor C2 has a coupling function. The node N2 is grounded via the capacitor C1 in the ac fashion, and the potential of the node N2 is at the ground level in the transitional state in which the power supply voltage VDD2 is rising.

Figure 2:
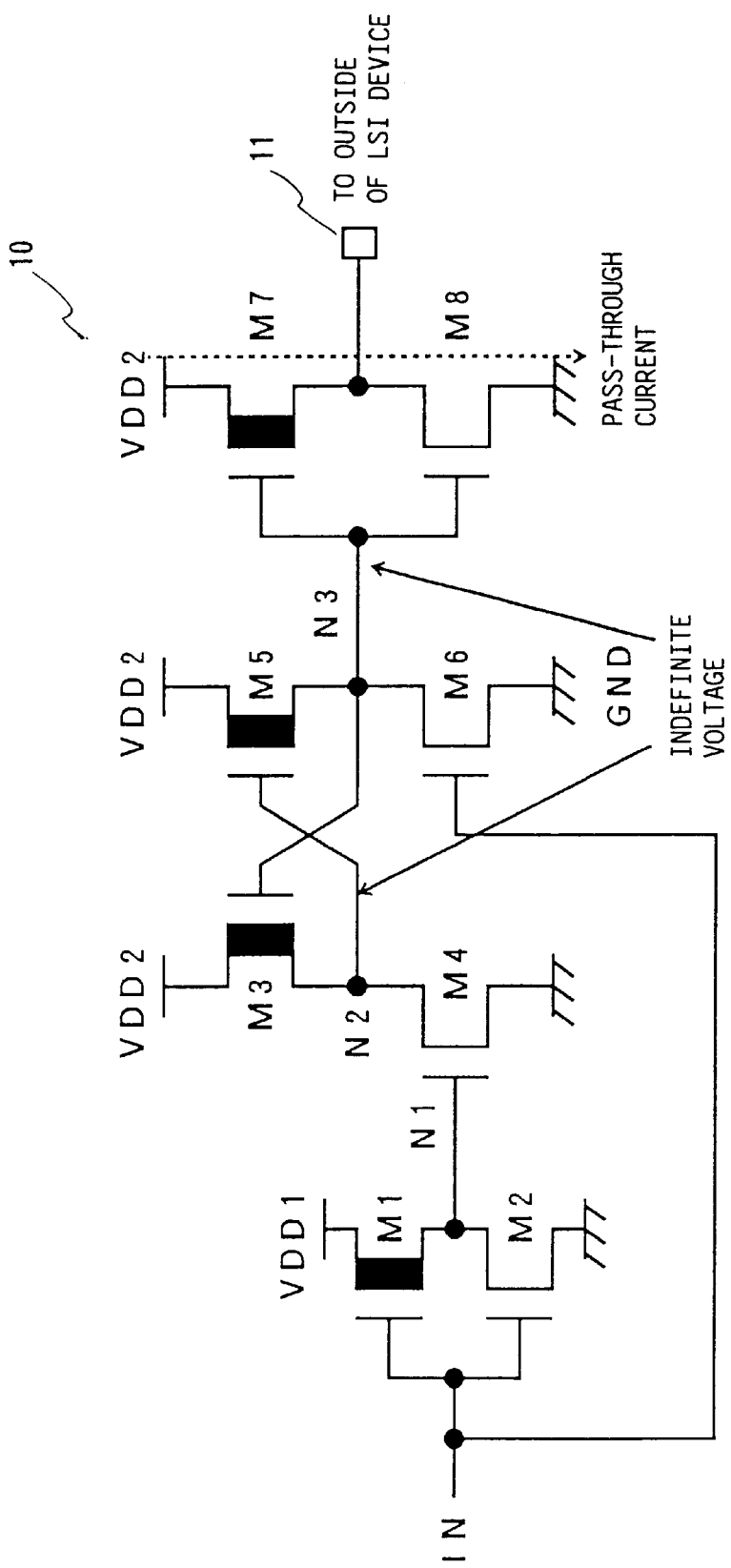
FIG. 2 is a circuit diagram of a conventional circuit including the level converter shown in FIG. 1.
Figure 3:
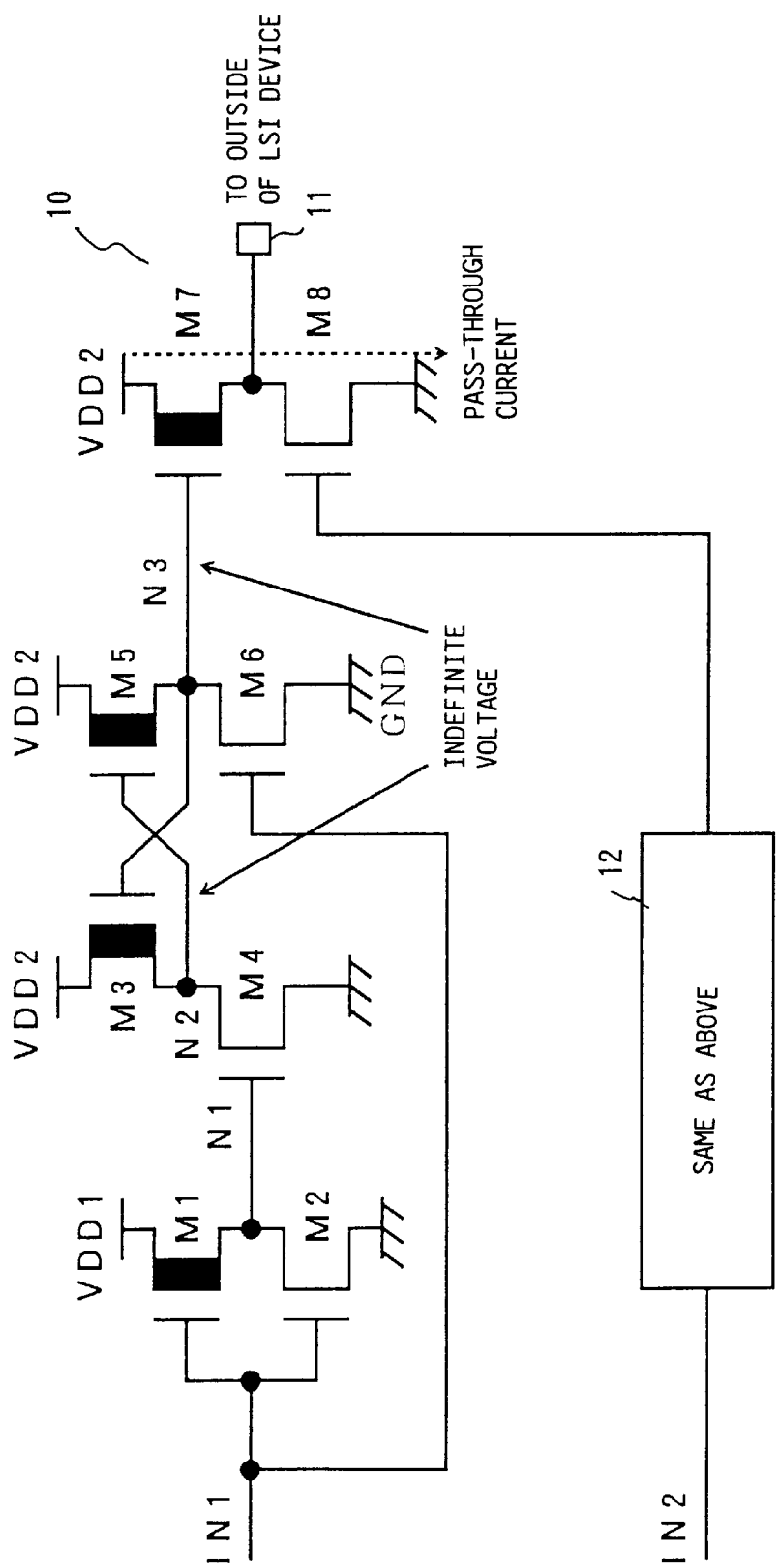
FIG. 3 is a circuit diagram of another conventional circuit including the level converter shown in FIG. 1.
Figure 4:
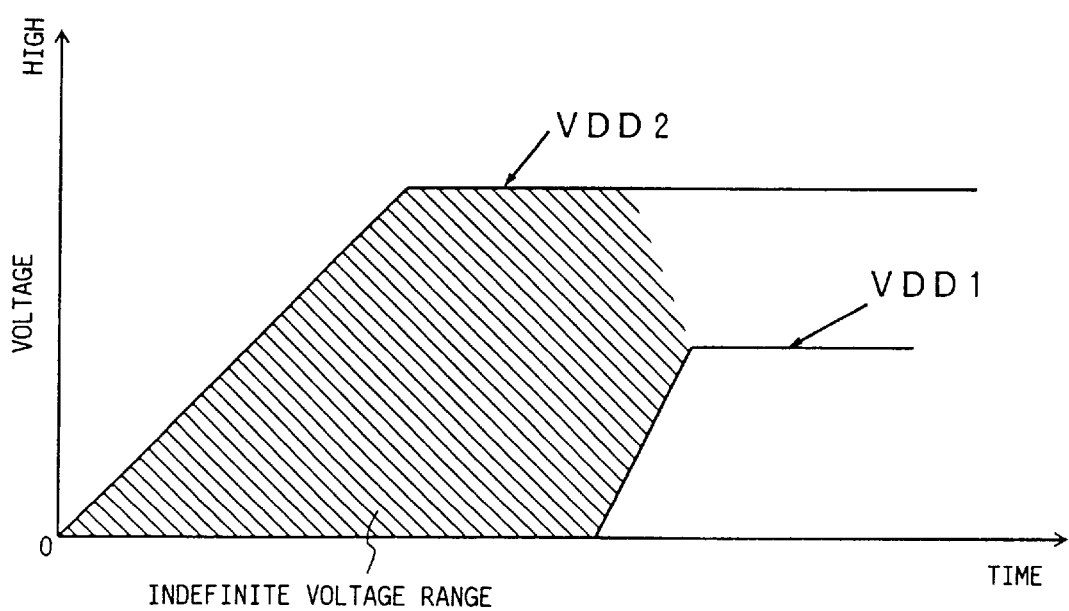
FIG. 4 is a graph showing an operation of the conventional level converter.

Hence, a definite potential difference between the nodes N2 and N3 is produced in a state in which the internal power supply voltage VDD1 is 0 V while the power supply voltage VDD2 is rising. Thus, the state of the level converter can be certainly defined immediately after the power supply voltage VDD2 starts to rise. That is, the potential of the node N3 rises gradually, while the potential of the node N2 remains at the ground level. Hence, the potentials of the nodes N2 and N3 do not become indefinite. Hence, if the buffer circuit 10 shown in FIG. 2 or FIG. 3 is provided so as to follow the level converter, the transistor M7 of the buffer circuit 10 is immediately moved toward the OFF state, and the transistor M8 thereof is immediately moved toward the ON state. Hence, the pass-through current does not flow in the buffer circuit 10. Thereafter, the internal power supply voltage VDD1 rises and the level converter can operate.

As can be seen from the above description, it is possible to prevent the nodes N2 and N3 from being in the indefinite state by providing means for causing the potential of at least one of the nodes N2 and N3 to be changed to the ground potential or the power supply voltage VDD2 when the power supply voltage VDD2 rises.

The capacitors C1 and C2 function as loads of the power supply after the power supply voltage VDD2 rises to the given level.

Figure 7:
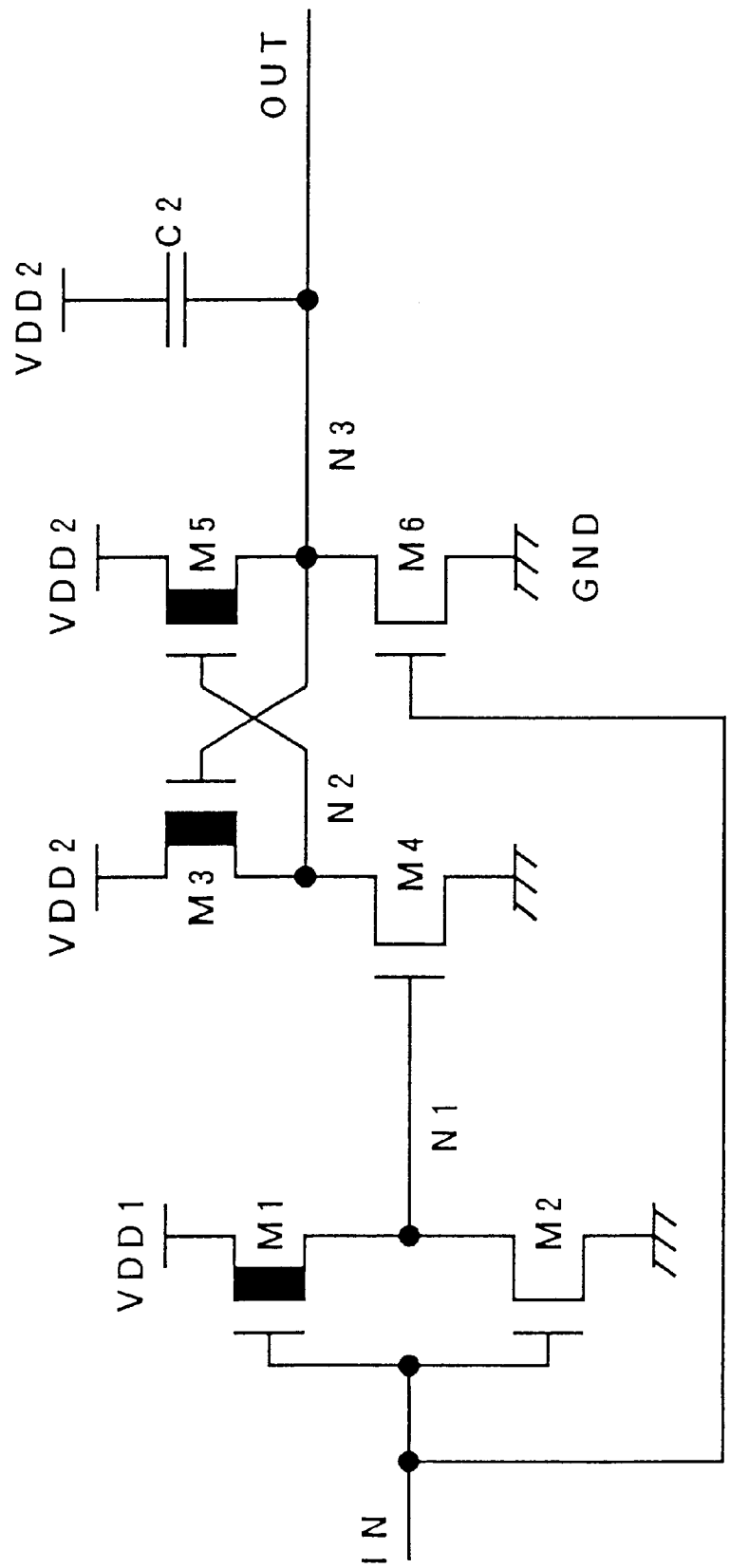
FIG. 7 is a circuit diagram of a first variation of the circuit configuration shown in FIG. 5.

FIG. 7 is a circuit diagram of a first variation of the circuit configuration shown in FIG. 5. In FIG. 7, parts that are the same as those shown in the previously described figures are given the same reference numbers. In FIG. 7, only the capacitor C2 is provided and the capacitor C1 is not used. Due to the function of the capacitor C2, the potential of the node N3 is caused to rise toward the power supply voltage VDD2 when the power supply voltage VDD2 rises. The potential of the node N2 remains at the ground level GND.

Figure 8:
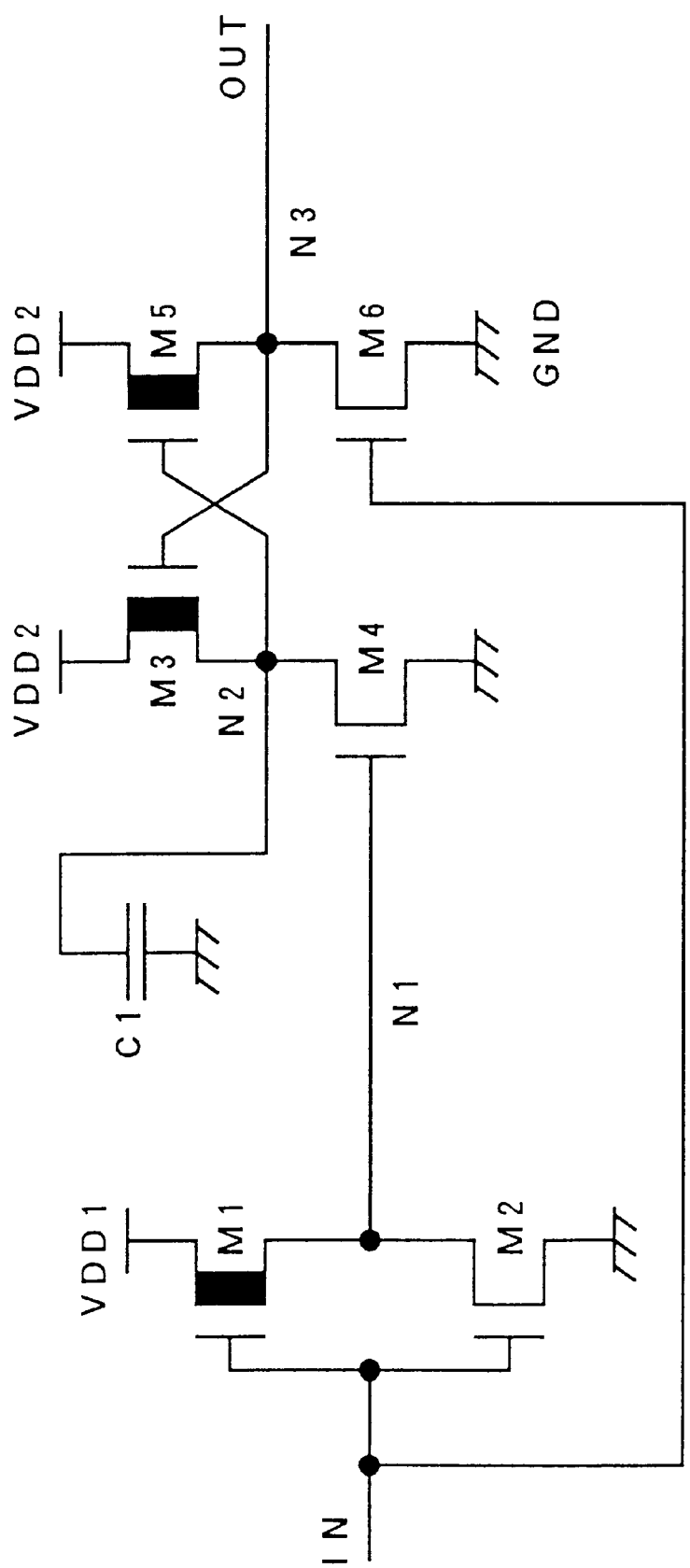
FIG. 8 is a circuit diagram of a second variation of the circuit configuration shown in FIG. 5.

FIG. 8 is a circuit diagram of a second variation of the circuit configuration shown in FIG. 5. In FIG. 8, parts that are the same as those shown in the previously described figures are given the same reference numbers. In FIG. 8, only the capacitor C1 is provided and the capacitor C2 is not used. Due to the function of the capacitor C1, the potential of the node N2 is caused to remain at the ground potential when the power supply voltage VDD2 rises. Hence, it is possible to avoid the situation in which the potential of the node N2 is indefinite. Since the potential of the node N2 remains at the ground level GND, the potential of the node N3 rises toward the power supply voltage VDD2.

Figure 9:
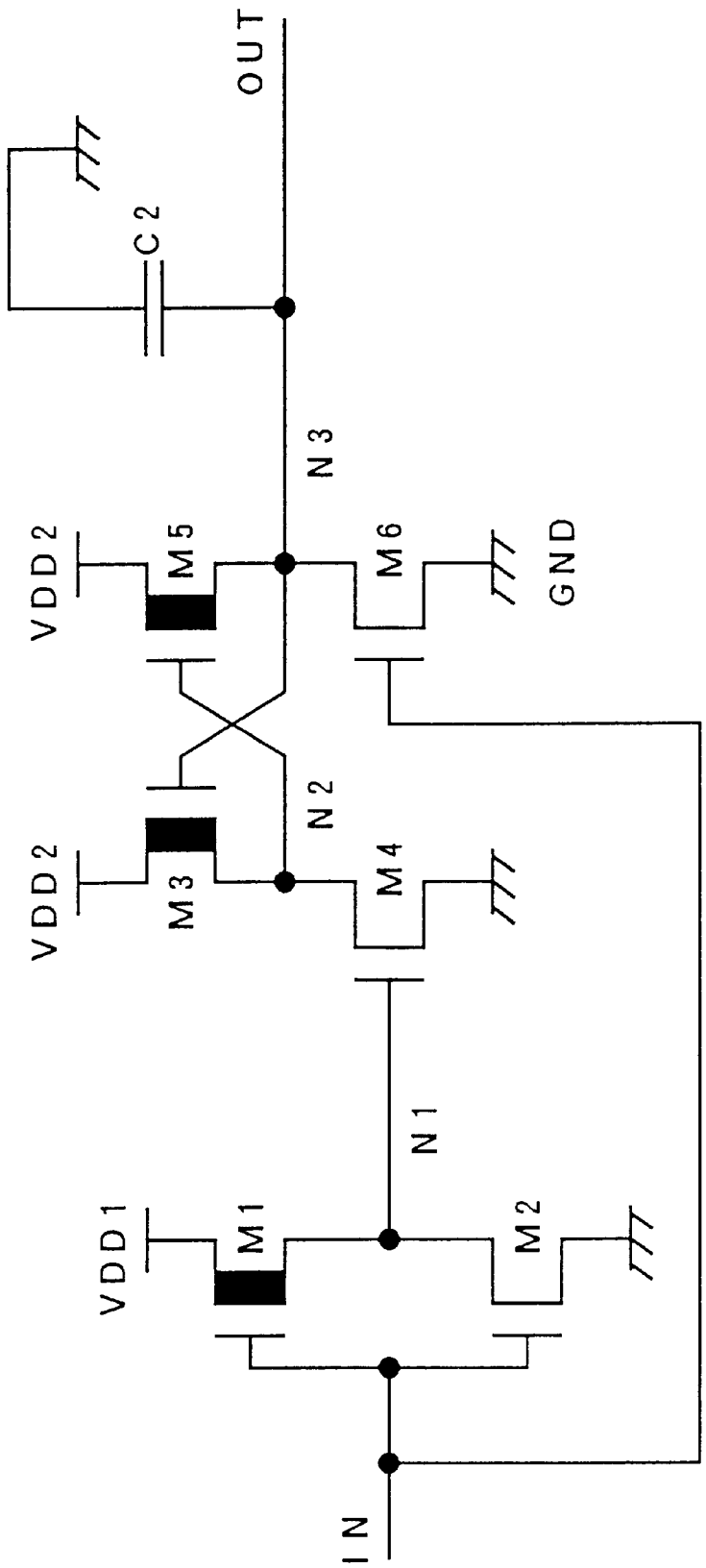
FIG. 9 is a circuit diagram of a third variation of the circuit configuration shown in FIG. 5.

FIG. 9 is a circuit diagram of a third variation of the circuit configuration shown in FIG. 5. In FIG. 9, parts that are the same as those shown in the previously described figures are given the same reference numbers. The capacitor C2 shown in FIG. 9 is grounded, and operates in the same manner as that of the capacitor C1 shown in FIG. 8.

Figure 10:
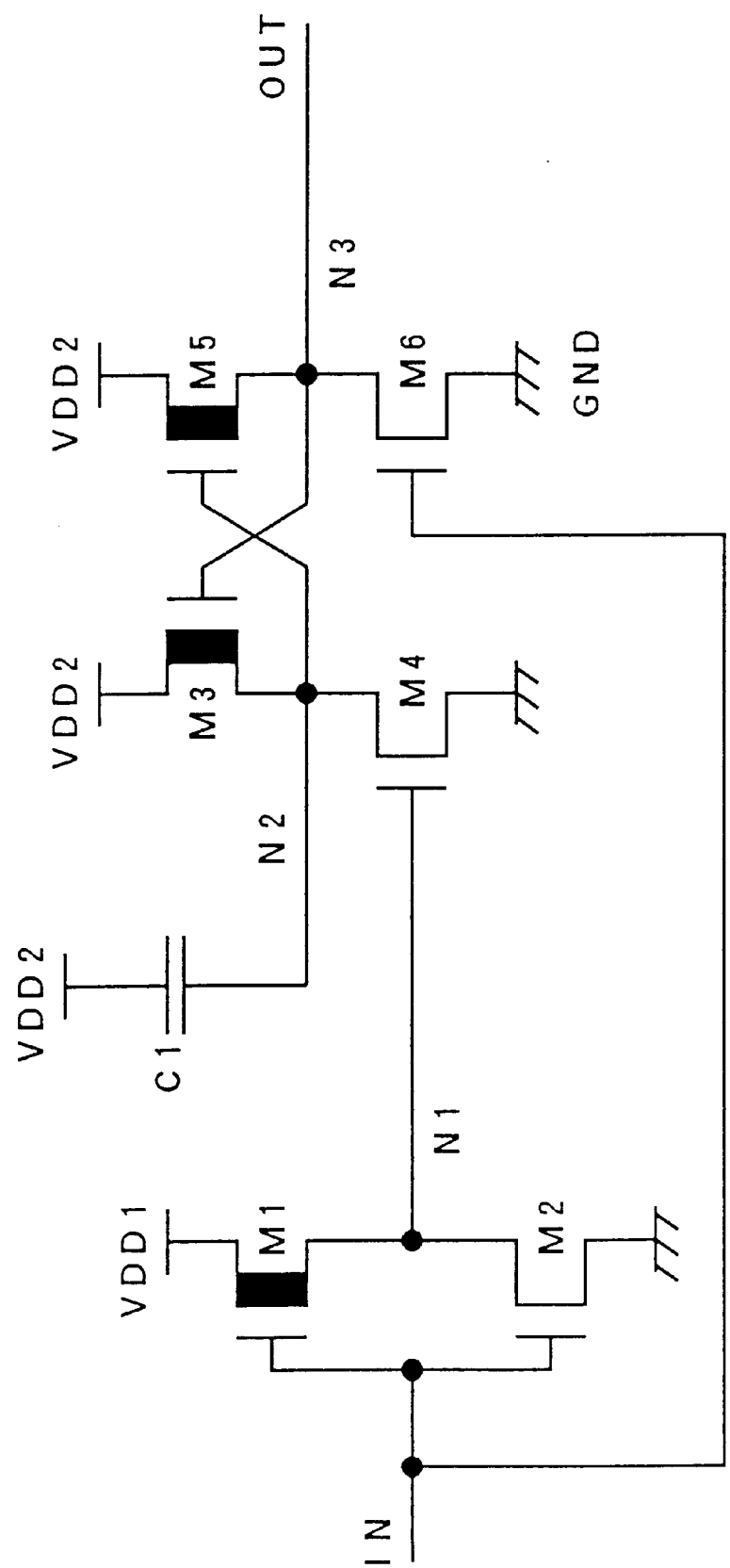
FIG. 10 is a circuit diagram of a fourth variation of the circuit configuration shown in FIG. 5.

FIG. 10 is a circuit diagram of a fourth variation of the circuit configuration shown in FIG. 5. In FIG. 10, parts that are the same as those shown in the previously described figures are given t he same reference numbers. The capacitor C1 shown in FIG. 10 is connected to the power supply voltage VDD2, and operates in the same manner as that of the capacitor C2 shown in FIG. 7.

Figure 11:
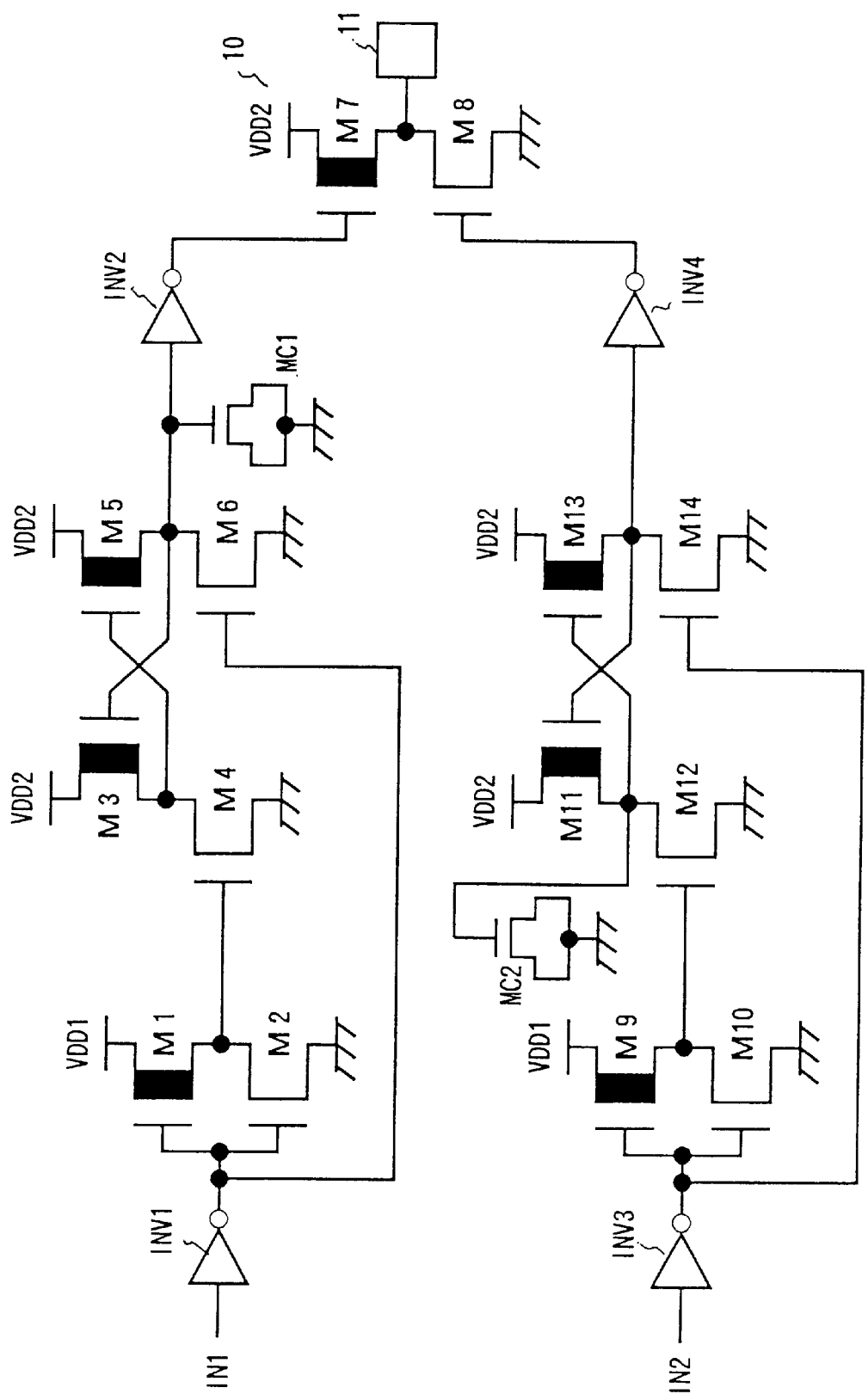
FIG. 11 is a circuit diagram of a semiconductor device equipped with the level converter configured according to the present invention.

FIG. 11 is a diagram of a part of a semiconductor integrated circuit device equipped with the level converter of the present invention. In FIG. 11, parts that are the same as those shown in the previously described figures are given the same reference numbers. The signal IN1 passes through an inverter INV1 supplied with the internal power supply voltage VDD1 and the inverter made up of the transistors M1 and M2 also supplied with the internal power supply voltage VDD1, and is applied to the level converter made up of the transistors M3 through M6. The level converter converts the VDD1-level signal into a VDD2-level signal, which passes through an inverter INV2 supplied with the power supply voltage VDD2. Then, the output signal of the inverter INV2 is applied to the transistor M7 of the buffer circuit 10. A symbol "MC1" shown in FIG. 11 corresponds to the capacitor C2, and is a MOS capacitor.

The signal IN2 passes through an inverter INV3 supplied with the internal power supply voltage VDD1 and an inverter made up of transistors M9 and M10 also supplied with the internal power supply voltage VDD1, and is applied to a level converter made up of transistors M11–M14. The level converter converts the VDD1-level signal into a VDD2-level signal, which passes through an inverter INV4 which operates with the power supply voltage VDD2. The output signal of the inverter INV4 is then applied to the gate of the transistor M8 of the buffer circuit 10. A symbol "MC2" corresponds to the capacitor C1 shown in FIG. 8, and is a MOS capacitor.

When the internal power supply voltage VDD1 is 0 V while the power supply voltage VDD2 is rising from 0 V, the potential of the node at which the transistors M5 and M6 are connected together is caused to remains at the ground potential due to the function of the capacitor MC1. Further, due to the function of the capacitor MC2, the potential of the node at which the transistors M11 and M12 are connected together is caused to remain at the ground potential. Hence, the output potential of the inverter INV2 is caused to rise toward the power supply voltage VDD2, and the output potential of the inverter INV4 is caused to fall to the ground potential. Thus, the transistors M7 and M8 are moved toward the OFF state, so that the pass-through current does not flow in the buffer circuit 10.

The above embodiment of the present invention and the variations thereof employ the capacitor C1 and/or capacitor C2 having a fixed capacitance value. Alternatively, it is possible to selectively make a connection between the node N2 and the associated capacitor and selectively make a connection between the node N3 and the associated capacitor. In some practical cases, the speed of rising of the node potential obtained when the capacitor is connected to the node N2 is slightly different from the speed of rising of the node potential obtained when the capacitor is connected to the node N3. When taking into account the above, it may be preferable to provide a mechanism which selectively connects the capacitor to the node N2 or the node N3.

Figure 12:
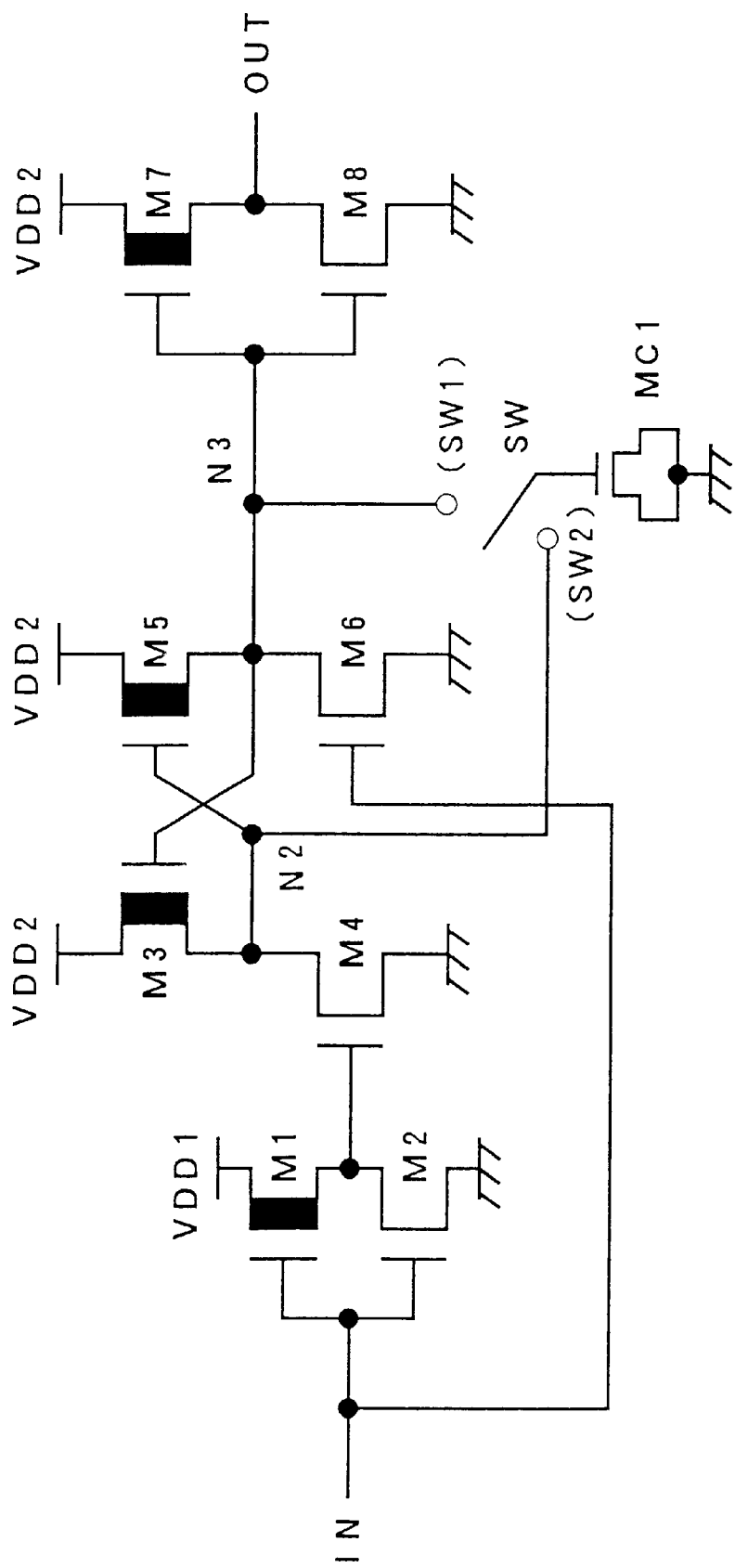
FIG. 12 is a circuit diagram of a level converter equipped with a switch according to the present invention.

FIG. 12 is a circuit diagram of a level converter designed taking into consideration the above. In FIG. 12, parts that are the same as those shown in the previously described figures are given the same reference numbers. A switch SW is provided which selectively connects the capacitor MC1 to either a switch contact SW1 or a switch contact SW2. The switch contact SW1 is connected to the node N3, and the switch contact SW2 is connected to the node N2. It is possible to make a decision as to which one of the contacts SW1 and SW2 should be connected to the capacitor MC1 by simulating the operation of the circuit by means of a computer to investigate the speeds at which the potentials of the nodes N2 and N3 rise to the given level.

Figure 13:
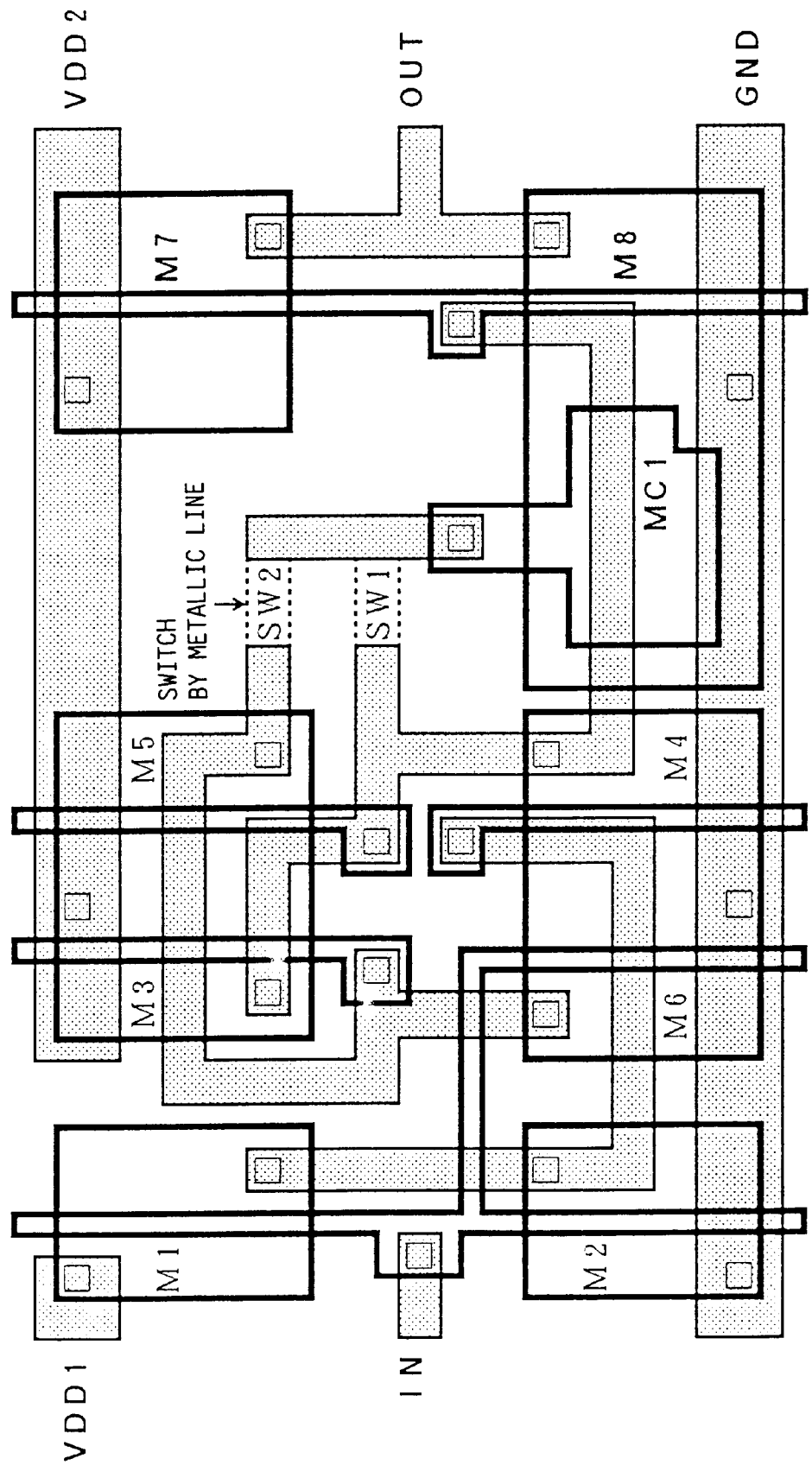
FIG. 13 is a diagram of a layout pattern of the semiconductor device equipped with the circuit shown in FIG. 12.

FIG. 13 is a diagram of a layout pattern of a semiconductor device which realizes the circuit configuration shown in FIG. 12. In FIG. 13, parts that are the same as those shown in the previously described figures are given the same reference numbers. A mask pattern used in the production process for the semiconductor device is the same as the layout pattern formed on a chip of the semiconductor device shown in FIG. 13. The function of the switch SW shown in FIG. 12 is realized by metallic lines labeled SW1 and SW2 in FIG. 13. The metallic line SW1 connects a wiring (interconnection) pattern extending from the capacitor MC1 and a wiring pattern connected to the gates of the transistors M7 and M8. The metallic line SW2 connects the wiring pattern extending from the capacitor MC1 to the gate of the transistor M5.

Figure 14:
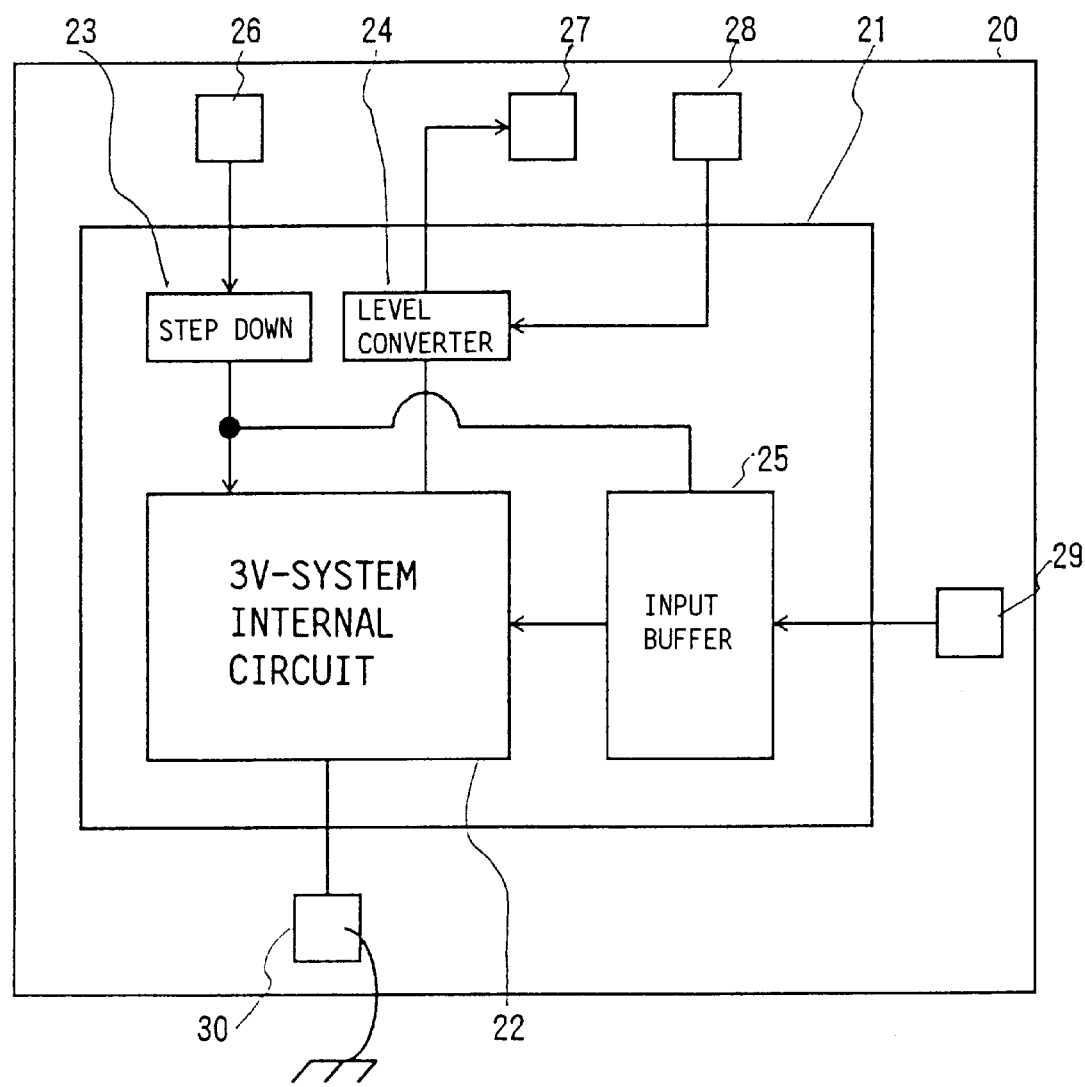
FIG. 14 is a block diagram of a semiconductor device equipped with the level converter configured according to the present invention.

FIG. 14 is a block diagram of a semiconductor device equipped with the level converter of the present invention. The semiconductor device shown in FIG. 14 has a configuration which produces the internal power supply voltage VDD1 from the power supply voltage VDD2 externally supplied. The semiconductor device has a chip 20 on which an internal circuit formation area 21 is defined. Pads 26–30 are arranged around the internal circuit formation area 21. In the internal circuit formation area 21 is provided with a 3-V system internal circuit 22 which operates with a power supply voltage of 3 V, a voltage step-down circuit 23, a level converter 24 configured according to the present invention, and an input buffer circuit 25.

The voltage step-down circuit 23 steps down the power supply voltage of 5 V (=VDD2) externally applied to the pad 26 and generates a resultant internal power supply voltage of 3 V (=VDD1). The internal power supply voltage thus produced is applied to the internal circuit 22 and the input buffer circuit 25. The aforementioned transistors M1, M2, M9 and M10 are components of the internal circuit 22.

The level converter 24 configured according to the present invention has the function of converting a 3V signal into a 5V signal. The level converter 24 is made up of the aforementioned transistors M3–M6 and the capacitor C1 and/or C2 (or MC1) shown in FIGS. 5 and 7 through 13. Further, the block of the level converter 24 shown in FIG. 14 includes the aforementioned buffer circuit 10 and the inverters INV2 and INV4. The level converter 24 is connected to the pad 28, to which the power supply voltage VDD2 of 5 V is externally applied. The structure shown in FIG. 14 has the two pads 26 and 28 which receive the 5V power supply voltage VDD2. Alternatively, only one pad may be used so that it is commonly connected to the voltage step-down circuit 23 and the level converter 24.

The input buffer circuit 25 operates with the internal power supply voltage VDD1 equal to 3 V, and buffers a signal applied to the pad 29. The buffered signal is applied to the internal circuit 22. If the signal applied to the pad 29 has a voltage amplitude ranging from 0 V to 5 V (a 5 V system), the output signal of the input buffer 25 swings between 0 V and 3 V because the input buffer circuit 25 operates with the voltage VDD1 of 3 V. When the signal applied to the pad 29 is a 3-V system signal, it passes through the input buffer circuit 25 without any substantial modification, and enters the internal circuit 22. A pad 30 is a ground terminal.

At the moment the power supply voltage VDD2 is applied to the pads 26 and 28, the voltage step-down circuit 23 does not produce the internal power supply voltage VDD1. At this time, the internal power supply voltage VDD1 is equal to 0V, as shown in FIG. 6. As has been described previously, the state of the level converter 24 is rapidly defined due to the function of the capacitors C1 and/or C2 (MC1) provided in the level converter 24. Hence, the pass-through current does not flow substantially.

In the practical formation of the semiconductor device shown in FIG. 14, a large number of pads (not shown therein) are provided around the internal circuit formation area 21. A plurality of level converters, each being configured in the same manner as the level converter, are provided in the internal circuit formation area 21. A plurality of input systems, each being configured in the same manner as the input system having the input buffer 25, are provided in the internal circuit formation area 21. In FIG. 14, the pad 27 is used to output the signal to the outside of the device, and the pad 29 is used to input the signal from the outside thereof. As an alternative, the pad 27 or pad 29 can be used as an input/output common terminal. For example, when the pad 27 is used as a common terminal as described above, an input buffer having the same configuration as the input buffer 25 is connected to the pad 27. The internal circuit 22 can include an arbitrary circuit configuration, and can include, for example, a CPU core, a ROM, a RAM and peripheral circuits thereof. If the above components are included in the internal circuit formation area 21, the semiconductor device shown in FIG. 14 may be a microcomputer or the like.

Figure 15:
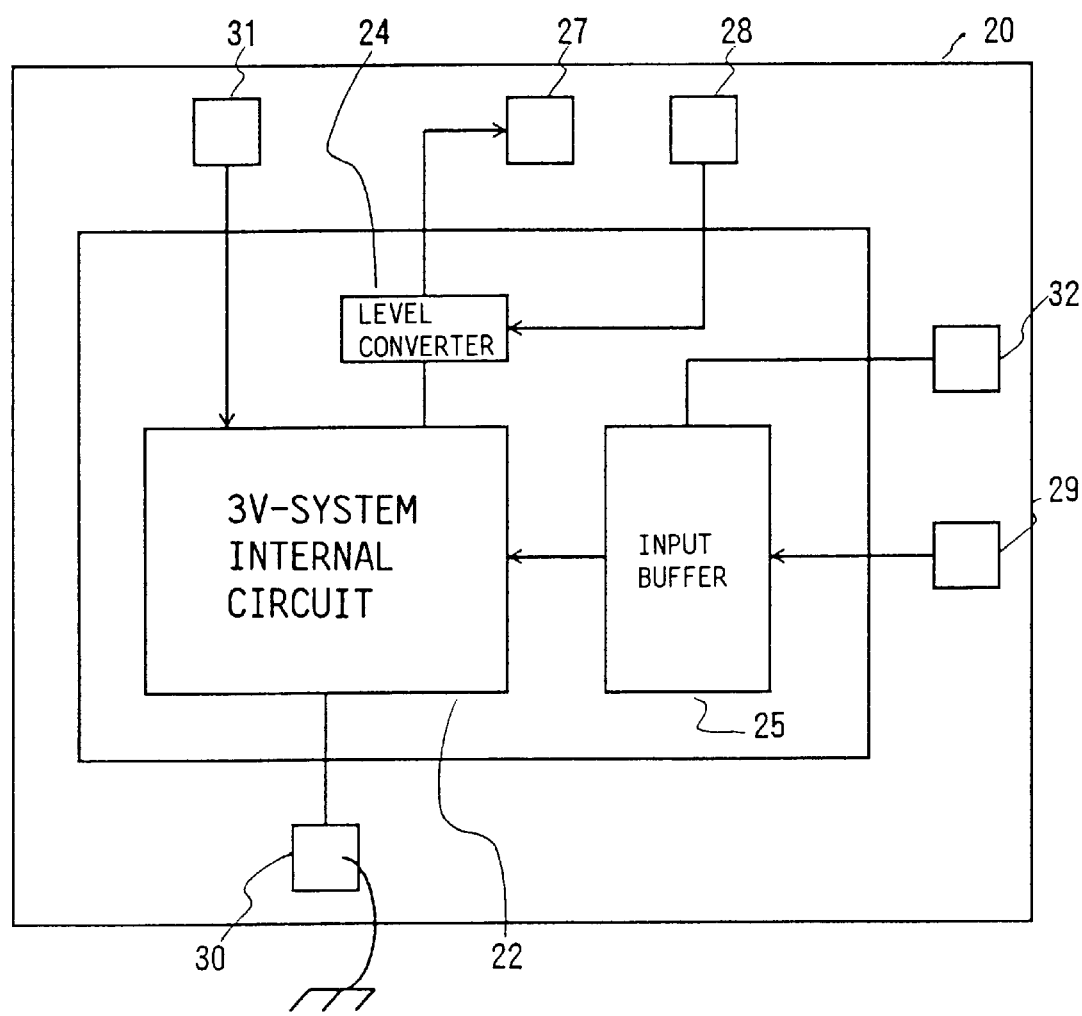
FIG. 15 is a block diagram of another semiconductor device equipped with the level converter configured according to the present invention.

FIG. 15 is a block diagram of another semiconductor device which externally receives both the power supply voltages VDD1 and VDD2. Hence, the semiconductor device shown in FIG. 15 does not have the voltage step-down circuit 23 shown in FIG. 14. The internal power supply voltage VDD1 of 3 V is directly applied to the internal circuit 22 via a pad 31. The voltage VDD1 is also applied to a pad 32. One pad can be used instead of the pads 31 and 32 so that the internal circuit 22 and the input buffer 25 are commonly connected thereto.

The present invention is not limited to the specifically disclosed embodiments, variations and modifications, and other variations and modifications may be made without departing from the scope of the present invention.

What is claimed is:

1. A level converter comprising:
    a first circuit which converts a first level of a signal into a second level which is higher than the first level; and
    a second circuit which settles a potential of a given node of the level converter at a defined level when the level converter is in a transitional state in which a power supply voltage is changing.

2. The level converter as claimed in claim 1, wherein:
    the given node is an output terminal of the level converter via which a converted signal having the second level is output; and
    said second circuit sets a voltage of said output terminal of the level converter to either a high-potential level of a power supply voltage supplied to the level converter or a low-potential level thereof.

3. The level converter as claimed in claim 2, wherein:
    the first circuit comprises first and second transistors having a P channel, and third and fourth transistors having an N channel;
    the first and third transistors are connected in series between the high-potential and low-potential levels of the power supply voltage;
    the second and fourth transistors are connected in series between the high-potential and low-potential levels of the power supply voltage;
    the first transistor has a gate connected to a first node at which the second and fourth transistors are connected in series, the first node forming the output terminal of the level converter;
    the second transistor has a gate connected to a second node at which the first and third transistors are connected in series;
    the signal applied to the first circuit and an inverted version thereof are applied to gates of the fourth and third transistors; and
    said second circuit comprises a capacitor having a first end connected to at least one of the first and second nodes, and a second end connected to one of the high-potential level and the low-potential level.

4. The level converter as claimed in claim 3, wherein said capacitor is a MOS capacitor.

5. The level converter as claimed in claim 3, wherein said second circuit comprises a switch which selectively connects said capacitor to one of the first and second nodes.

6. A semiconductor device comprising:
    an internal circuit;
    a first level converter which has a first circuit which converts a first level of a signal output by the internal circuit into a second level which is higher than the first level;
    a buffer circuit which buffers an output signal of the first level converter having the second level; and
    a terminal connected to said buffer circuit and used to make a connection with an external element,
    said first level converter comprising a second circuit which settles a potential of a given node of the first level converter at a defined level when the first level converter is in a transitional state in which a power supply voltage is changing.

7. The semiconductor device as claimed in claim 6, wherein:
    said internal circuit operates with a first power supply;
    said first level converter operates with a second power supply; and
    the second power supply has a voltage higher than that of the first power supply.

8. The semiconductor device as claimed in claim 7, wherein said semiconductor device further comprises:
    a first terminal used to connect the first power supply to said internal circuit; and
    a second terminal used to connect the second power supply to said first level converter.

9. The semiconductor device as claimed in claim 7, wherein said semiconductor device further comprises:
    a first terminal used to connect the second power supply to a voltage step-down circuit; and
    said voltage step-down circuit which steps down the voltage of the second power supply and thus produces the voltage of the first power supply.

10. The semiconductor device as claimed in claim 6, further comprising a second level converter having a same configuration as that of the first level converter,
    wherein said buffer circuit buffers output signals respectively output by said first and second level converters and outputs a resultant signal to said terminal.

11. The semiconductor device as claimed in claim 6, wherein:
    the given node is an output terminal of the first level converter via which a converted signal having the second level is output; and
    said second circuit sets a voltage of said output terminal of the first level converter to either a high-potential level of a power supply voltage supplied to the first level converter or a low-potential level thereof.

12. The semiconductor device as claimed in claim 11, wherein:

the first circuit comprises first and second transistors of a P channel, and third and fourth transistors of an N channel;

the first and third transistors are connected in series between the high-potential and low-potential levels of the power supply voltage;

the second and fourth transistors are connected in series between the high-potential and low-potential levels of the power supply voltage;

the first transistor has a gate connected to a first node at which the second and fourth transistors are connected in series, the first node forming the output terminal of the first level converter;

the second transistor has a gate connected to a second node at which the first and third transistors are connected in series;

the signal applied to the first circuit and an inverted version thereof are applied to gates of the fourth and third transistors; and said second circuit comprises a capacitor having a first end connected to at least one of the first and second nodes, and a second end connected to one of the high-potential level and the low-potential level.

13. The semiconductor device as claimed in claim 12, wherein said capacitor is a MOS capacitor.

14. The semiconductor device as claimed in claim 12, wherein said second circuit comprises a switch which selectively connects said capacitor to one of the first and second nodes.

* * * * *